US008026601B2

(12) United States Patent
Cho

(10) Patent No.: US 8,026,601 B2
(45) Date of Patent: Sep. 27, 2011

(54) ENCAPSULATED WAFER LEVEL PACKAGE WITH PROTECTION AGAINST DAMAGE AND MANUFACTURING METHOD

(75) Inventor: In Sik Cho, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 475 days.

(21) Appl. No.: 12/076,903

(22) Filed: Mar. 25, 2008

(65) Prior Publication Data

US 2008/0237896 A1    Oct. 2, 2008

(30) Foreign Application Priority Data

Mar. 30, 2007    (KR) .................. 10-2007-0031931

(51) Int. Cl.
    H01L 23/48    (2006.01)
    H01L 23/52    (2006.01)
    H01L 29/40    (2006.01)
    H01L 23/28    (2006.01)
(52) U.S. Cl. ......... 257/737; 257/738; 257/780; 257/787
(58) Field of Classification Search .................. 257/737, 257/738, 787, 780; 438/462
    See application file for complete search history.

(56) References Cited

U.S. PATENT DOCUMENTS

| | | | | |
|---|---|---|---|---|
| 5,608,265 A * | 3/1997 | Kitano et al. | | 257/738 |
| 5,923,954 A * | 7/1999 | Cho | | 438/108 |
| 6,323,551 B1 * | 11/2001 | Anzai | | 257/737 |
| 6,362,532 B1 * | 3/2002 | Brooks et al. | | 257/787 |
| 6,420,244 B2 | 7/2002 | Lee | | |
| 6,541,848 B2 * | 4/2003 | Kawahara et al. | | 257/690 |
| 6,557,769 B2 * | 5/2003 | Puschner et al. | | 235/492 |
| 6,774,500 B1 * | 8/2004 | Nakayama | | 257/788 |
| 6,852,607 B2 | 2/2005 | Song et al. | | |
| 7,002,245 B2 * | 2/2006 | Huang et al. | | 257/701 |
| 7,019,397 B2 * | 3/2006 | Ohuchi et al. | | 257/734 |
| 7,122,906 B2 * | 10/2006 | Doan | | 257/778 |
| 7,358,154 B2 * | 4/2008 | Poo et al. | | 438/462 |
| 7,405,138 B2 * | 7/2008 | Ohuchi et al. | | 438/462 |
| 2002/0089043 A1 * | 7/2002 | Park et al. | | 257/668 |
| 2004/0130024 A1 * | 7/2004 | Tsukahara et al. | | 257/737 |
| 2005/0029668 A1 * | 2/2005 | Poo et al. | | 257/773 |
| 2005/0205987 A1 * | 9/2005 | Hwee et al. | | 257/691 |
| 2005/0224969 A1 * | 10/2005 | Wu | | 257/737 |
| 2007/0258683 A1 * | 11/2007 | Rolston et al. | | 385/88 |
| 2008/0006910 A1 * | 1/2008 | Miyata et al. | | 257/622 |
| 2008/0185603 A1 * | 8/2008 | Itoi et al. | | 257/98 |
| 2008/0197455 A1 * | 8/2008 | Fukuda | | 257/620 |
| 2010/0072600 A1 * | 3/2010 | Gerber | | 257/686 |

* cited by examiner

*Primary Examiner* — Minh T Tran
*Assistant Examiner* — Teresa M Arroyo
(74) *Attorney, Agent, or Firm* — Lee & Morse, P.C.

(57) ABSTRACT

A packaged semiconductor device may include a substrate including at least one device layer and at least one connector arranged thereon, and a resin cover covering each side of the substrate, the resin cover on at least one side of the substrate including an opening exposing the connector and the resin cover on at least one other side of the substrate exposing a portion of the substrate.

23 Claims, 11 Drawing Sheets

ENCAPSULATED WAFER LEVEL PACKAGE WITH PROTECTION AGAINST DAMAGE AND MANUFACTURING METHOD

BACKGROUND OF THE INVENTION

1. Field of the Invention

Embodiments of the present invention relate to semiconductor chip packages, and methods of manufacturing thereof. More particularly, embodiments of the present invention relate to wafer level chip packages and methods of manufacturing wafer level chip packages that are capable of providing improved protection against damage, e.g., during handling and/or subsequent wafer and/or chip processing, and reducing chipping and/or cracking defects.

2. Description of the Related Art

In general, semiconductor chip packages are provided to physically protect a semiconductor chip while establishing input and output connection portion(s) for connecting the semiconductor chip to other device(s). As electronic devices are becoming smaller and more complex, it is desirable to package a semiconductor chip as soon as possible after the semiconductor chip is formed to help protect the electronic devices of the semiconductor chip from damage that may occur during subsequent handling, etc. In some cases, the semiconductor chips of a wafer are first completely separated from the wafer before being packaged. In such cases, however, the semiconductor chips are susceptible to damage that may occur during the dicing process itself, i.e., process for separating the semiconductor chip(s) from the wafer.

Therefore, in some cases, wafer level packaging is employed to package the semiconductor chip(s) while the semiconductor chip(s) are still on the wafer. Wafer level packaging may offer many advantages, e.g., protection during dicing, relatively small, e.g., thinner, package size, relatively lighter package weight, and/or reduced manufacturing cost, etc. In general, conventional wafer level packages fail to cover all sides, e.g., all six sides, of a semiconductor chip, and/or conventional methods of wafer-level packaging semiconductor devices generally employ, e.g., multiple depositing steps and/or multiple planarization steps. Therefore, improved wafer level packages and simplified methods of packaging semiconductor chips at the wafer level are desired.

SUMMARY OF THE INVENTION

Embodiments of the present invention are therefore directed to semiconductor packages and methods of manufacturing such semiconductor packages, which substantially overcome one or more of the problems due to the limitations and disadvantages of the related art.

It is therefore a feature of an embodiment of the present invention to provide packages that completely encapsulate the semiconductor chip, except for connector(s) formed and predetermined protruding portion(s) of a substrate of the semiconductor chip.

It is therefore a separate feature of an embodiment of the present invention to provide simplified methods of manufacturing wafer level packages that completely encapsulate the semiconductor chip, except for connector(s) formed and predetermined protruding portion(s) of a substrate of the semiconductor chip.

It is therefore a separate feature of an embodiment of the present invention to provide a method of manufacturing wafer level packages that completely encapsulate the semiconductor chip, except for connector(s) formed and predetermined protruding portion(s) of a substrate of the semiconductor chip, which requires only a single resin covering step such that all sides of the semiconductor chip are simultaneously covered.

At least one of the above and other features and advantages of the present invention may be realized by providing a packaged semiconductor device, including a substrate including at least one device layer and at least one connector arranged thereon, and a resin cover covering each side of the substrate, wherein the resin cover on at least one side of the substrate may include an opening exposing the connector and the resin cover on at least one other side of the substrate may expose a portion of the substrate.

The resin cover may be an outermost layer on each of the sides of the substrate. Each outer surface of the resin cover may be substantially or completely planar. A portion of the resin cover exposing the portion of the substrate may abut a sidewall of the exposed portion of the substrate, and an outer surface of the abutting portion of the resin cover may extend along a same plane as a plane along which a surface of the exposed portion of the substrate extends.

The substrate may include a top side, a bottom side, and a plurality of lateral sides, and the top side may include a plurality of the connectors arranged thereon, the resin cover on the top side may include a plurality of openings respectively exposing the connectors, and the resin cover on the another side of the substrate may be on at least one of the lateral sides, and may expose a portion of at least one of the lateral sides of substrate.

The resin cover may expose a portion of each of the lateral sides of the substrate. The resin cover may expose a portion of only two of the lateral sides of the substrate, the two lateral sides may be opposite each other. The resin cover may expose a portion of only one of the lateral sides of the substrate.

Other than the exposed at least one connector and the exposed portion of the at least one other side, the resin cover may completely encapsulate the substrate. The resin cover may be a single continuous layer. The exposed portion of the substrate may correspond to a lateral corner portion of the substrate.

A portion of the resin cover on the side of the substrate including the at least one connector may surround a lower portion of the connector, and may have a height of about 10% to about 80% of a height of the at least one connector along a direction substantially perpendicular to a plane along which a surface of the substrate on which the connector is arranged extends.

The substrate may have been cut from a wafer along a scribe line of the wafer, the scribe line having a width, such that the substrate may be a portion of the semiconductor wafer, and a thickness, relative to the other side of the substrate, of at least a portion of the resin cover abutting the at least one exposed portion of the substrate may be equal to or less than about 50% of the width of the scribe lane. The packaged semiconductor may be an MCP.

At least one of the above and other features and advantages of the present invention may be separately realized by providing a method of manufacturing a wafer level package, including forming at least one opening in a portion of a wafer surrounding a predetermined sub-portion of the wafer corresponding to a device to be separated from a remaining portion of the wafer, the opening completely extending from a top side of the wafer to a bottom side of the wafer, and the wafer sub-portion remaining connected to the remaining portion of the wafer by at least one wafer connecting portion, covering the wafer sub-portion with a resin cover, wherein the resin cover may fill the opening formed in the portion of the wafer surrounding the wafer sub-portion and cover each side of the wafer sub-portion, and completely separate the wafer sub-portion from the remaining portion of the wafer along a boundary defined by the at least one wafer connecting portion and the portion of resin cover corresponding to the filled opening.

At least one side of the wafer sub-portion may include a connector arranged thereon, and covering the wafer sub-portion may include completely covering the side of the wafer sub-portion having the at least one connector arranged thereon, except for the at least one connector arranged thereon.

Covering the wafer sub-portion may include completely encapsulating the wafer sub-portion, other than the at least one connector of the device and a separated side of the wafer connecting portion, wherein the separated side may correspond to the side of the wafer connecting portion exposed when separating the wafer sub-portion from the remaining portion of the wafer.

Covering the wafer sub-portion with the resin cover may include one of dipping the wafer in a thermosetting epoxy resin solution, and applying an epoxy layer using a spin coating process. Applying the epoxy layer using a spin coating process may include coating at least a top portion of the at least one connector with a coating repellent before covering the wafer sub-portion with the resin cover.

Applying the epoxy layer using a spin coating process may include, during the spin coating process using a spin chuck, temporarily elevating the wafer sub-portion away from an upper surface of the spin chuck to cover the bottom side of the wafer while simultaneously filling the opening and covering each of the other sides of the wafer sub-portion.

Dipping the wafer in a thermosetting epoxy resin solution may include partially dipping the wafer in the epoxy resin solution such that, other than an upper portion of the at least one connector, a remainder of the wafer is dipped into the epoxy resin solution.

Forming the at least one opening may include using at least one of a diamond blade and a laser having a first width, and completely separating the wafer sub-portion may include using at least one of a diamond blade and a laser having a second width, wherein the first width may be greater than the second width.

Forming the at least one opening may include removing a portion of the wafer in a scribe line of the wafer, and a thickness of a remaining portion of the resin cover relative to the respective side of the wafer-sub portion may be equal to or less than about 50% of a width of the scribe line of the wafer.

Covering the wafer sub-portion with the resin cover may be performed in a single covering process such that the opening formed in the portion of the wafer surrounding the wafer sub-portion and each side of the wafer sub-portion may be simultaneously or substantially simultaneously filled and covered, respectively. The method may further include, before covering or before completely separating, stacking at least another wafer on the wafer, wherein the at least another wafer may include another device to be integrated with the device on the wafer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
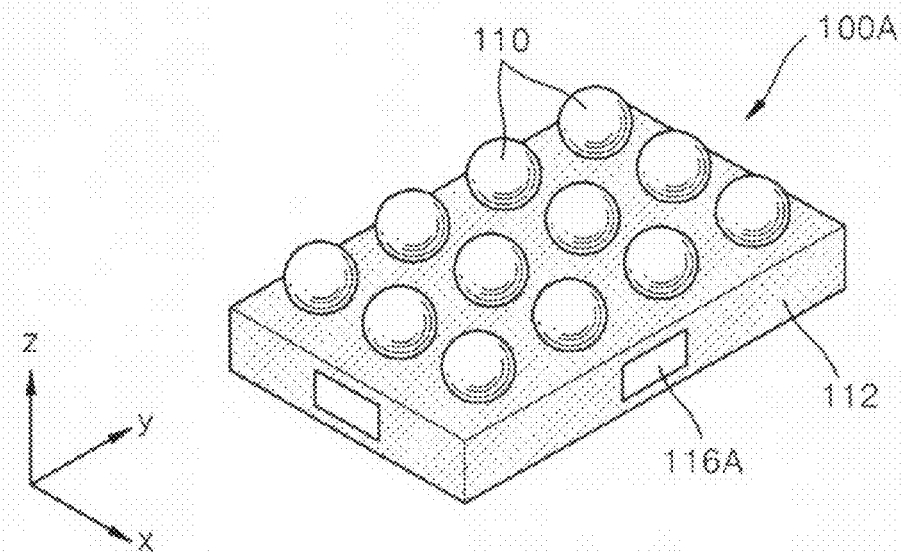
FIG. 1 illustrates a top-side view of a first exemplary embodiment of a wafer level package of a semiconductor chip.

Korean Patent Application No. 10-2007-0031931, filed on Mar. 30, 2007, in the Korean Intellectual Property Office, and entitled: "WAFER LEVEL PACKAGE PREVENTING A CHIPPING DEFECT AND MANUFACTURING METHOD THEREOF," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Additionally, it will be understood that when an element is referred to as being "continuous," the element is a single integrally formed member, while "substantially continuous" corresponds to separate portions of a member arranged next to each other, e.g., abutting, relatively close to each other, to form the member. Like reference numerals refer to like elements throughout the specification.

Figure 5:
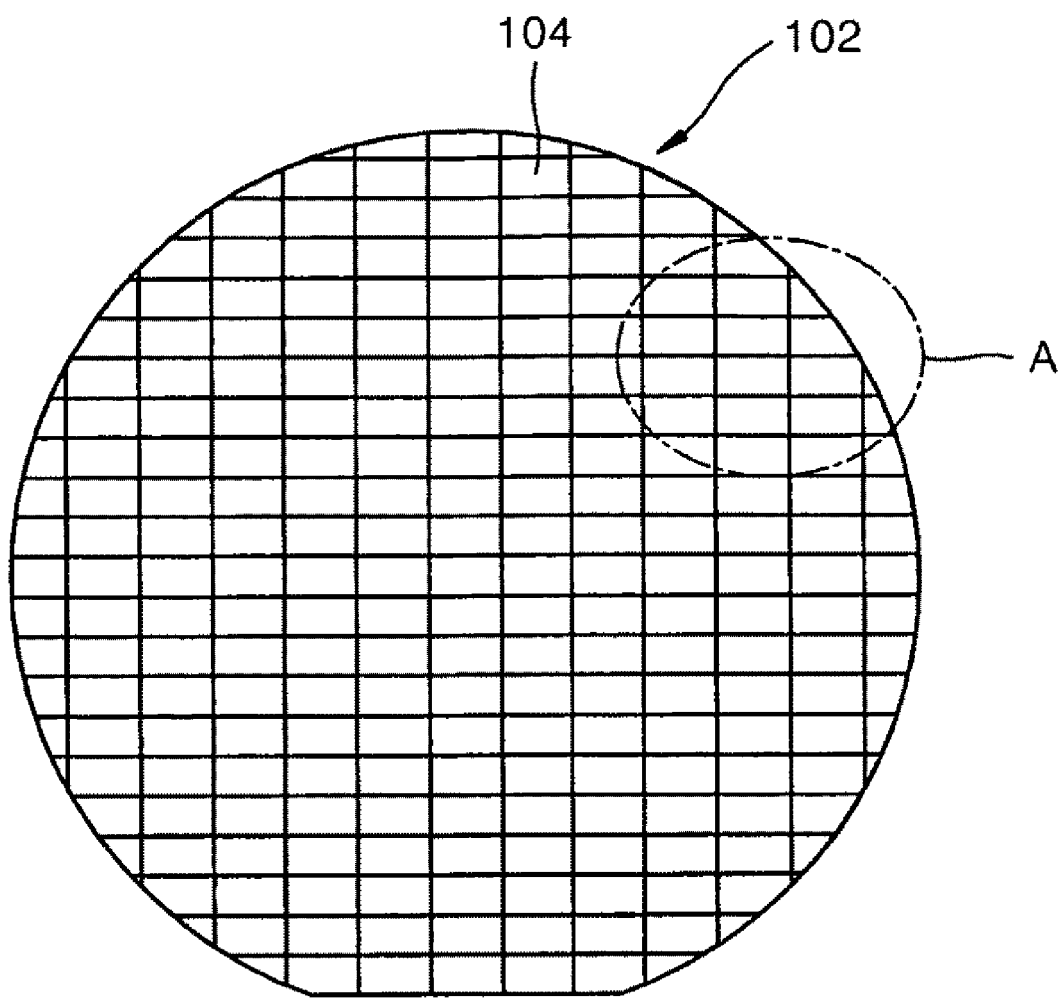
FIG. 5 illustrates a top view of an exemplary wafer including a plurality of semiconductor chips.
Figure 7:
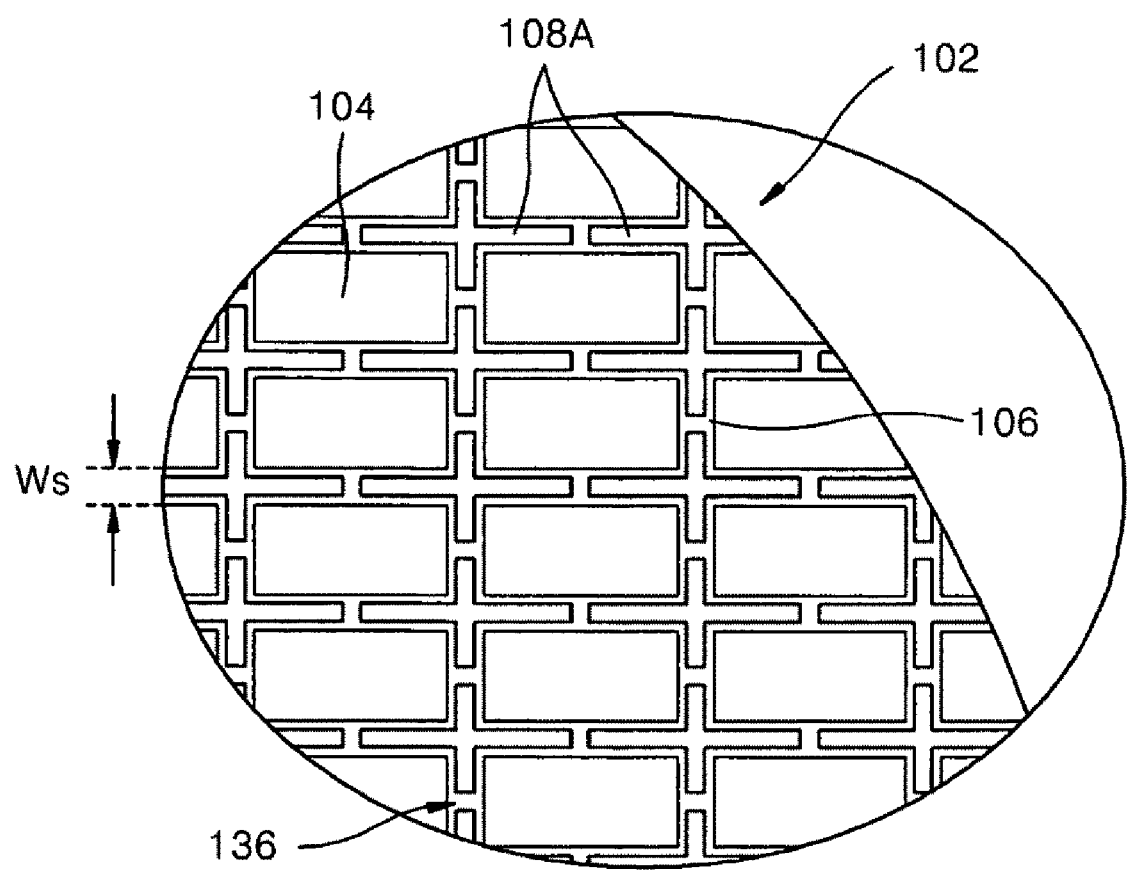
FIG. 7 illustrates a top view of a stage in an exemplary method for fabricating the wafer level package of FIG. 1.

FIG. 1 illustrates a first exemplary embodiment of a wafer level package 100A of a semiconductor chip 104 (see FIGS. 5 and 7). The wafer level package 100A may include a cover 112, which may be formed of, e.g., a resin, other molding materials known in art, etc. In such embodiments, the resin may include, e.g., an epoxy resin, a phenolic resin, etc.

The semiconductor chip 104 covered by the wafer level package 100A may include one or more connectors 110, and at least one protruding portion 116A exposed by the cover 112 of the wafer level package 100A. In some embodiments of the invention, e.g., the connector(s) 110 may be provided on a first side, e.g., a top side, of the semiconductor chip 104, and the protruding portion(s) 116A may be provided on a different side(s), e.g., lateral side(s), of the semiconductor chip 104. Embodiments of the invention are not, however, limited to such a configuration.

The connector(s) 110 may be arranged on at least one side of the semiconductor chip 104, and may be employed to connect the semiconductor chip 104 to external devices (not shown). The connector(s) 110 may include conductive material, and may be, e.g., a solder ball, a solder bump, a Cu bump (or Cu pillar), or Cu+ solder bump/pillar.

The protruding portion(s) 116A may be provided on at least one side of the semiconductor chip 104, and may correspond, e.g., to a portion of a substrate (not shown) of the semiconductor chip 104 that protrudes beyond other portion(s) of the respective side of the substrate. That is, e.g., the protruding portion(s) 116A may protrude beyond all other portion(s) of the respective side of the substrate from which it protrudes. More particularly, e.g., in some embodiments of the invention, the respective side(s) of the substrate including the protruding portion(s) 116A may be substantially or completely planar, but for the protruding portion(s) 116A protruding therefrom. Embodiments of the invention are not, however, limited to such substantially or completely planar sides. More particularly, the substrate may be, e.g., a respective portion of a semiconductor wafer 102 (see FIG. 5) such as a silicon wafer corresponding to the semiconductor chip 104, i.e., a portion of the semiconductor wafer diced from a remaining portion of the semiconductor wafer on which a plurality of semiconductor chips 104 may have been formed. Further, the protruding portion(s) 116A may serve to help protect the semiconductor chip 104 even after the semiconductor chip 104 is packaged. That is, e.g., together with the cover 112, the protruding portion(s) 116A may serve to protect the semiconductor chip 104 from damage.

In the description of exemplary embodiments, it will be assumed that the semiconductor chip 104 has a rectangular shape including six sides, i.e., a top side, a bottom side, and four lateral sides extending between the top and bottom sides. For example, the top side may correspond to an upper surface extending along a XY plane, the bottom side may correspond to a lower surface, i.e., lower relative to a Z axis, extending along another XY plane, and the lateral sides may extend along different YZ or XZ planes. However, embodiments of the invention are not limited thereto. For example, the semiconductor chip may have a substantially circular or rounded shape along the XY plane, and in such cases, may have, e.g., a single continuous lateral surface. More particularly, in the description of exemplary embodiments, it will be assumed that the connector(s) 110 are provided on the top side of the semiconductor chip 104, and the bottom side of the semiconductor chip is substantially or completely planar. Embodiments of the invention are not, however, limited thereto, and persons of ordinary skill in the art will appreciate the applicability of one or more aspects of the invention to a semiconductor chip irrespective of a shape thereof and/or the side(s) of the semiconductor chip including the connector(s) 110 and/or protruding portion(s) 116A.

The protruding portion(s) 116A may be provided at various portions, substantially central portion, corner portion, substantially left or right portion, etc., of the respective side of the semiconductor chip 104. In the exemplary embodiment of the wafer level package 100A illustrated in FIG. 1, the protruding portions 116A are provided at substantially central portions of the respective lateral sides of the semiconductor chip 104. The protruding portion(s) 116A may occupy a relatively small portion of the respective side of the semiconductor chip 104 from which they protrude such that a majority of the sides of the semiconductor chip 104 are covered by the cover 112.

Further, e.g., in some embodiments of the invention, only one protruding portion 116A may be provided on the semiconductor chip 104, while in other embodiments, e.g., more than one protruding portions 116A may be provided. For example, in some embodiments at least one protruding portion 116A may be provided on two sides, e.g., two opposing lateral sides, of the semiconductor chip 104. In some other embodiments of the invention, a plurality of protruding portion 116A may be provided on only one lateral side of the of the semiconductor chip 104. In some other embodiments of the invention, a plurality of the protruding portions 116A may be provided on a plurality of lateral sides of the semiconductor chip 104. In yet some other embodiments of the invention, a single and/or a plurality of the protruding portions 116A may be provided on each lateral side of the semiconductor chip 104. More particularly, the exemplary wafer level package 100A illustrated in FIG. 1, includes one protruding portion 116A at a central portion of each lateral side of the semiconductor chip 104 and/or a central portion of each lateral side of the cover 112. Embodiments of the invention are not, however, limited thereto.

In some embodiments of the invention, an exposed surface of the protruding portion(s) 116A, i.e., surface(s) exposed by the cover 112, may be substantially and/or completely planar, and may extend along a same plane as respective outer surface of portion(s) of the cover 112. In some embodiments of the invention, while a surface may be substantially planar, the respective surface may not be a smooth surface, i.e., the surface may be rugged or rough. Further, while various surfaces may be described as being substantially and/or completely planar, embodiments of the invention are not limited thereto.

More particularly, the respective portion(s) of the cover 112 may abut, and substantially and/or completely align with the respective protruding portion(s) 116A so as to form a substantially continuous surface. That is, e.g., in some embodiments of the invention, but for the connector(s) 110, the resulting wafer level package 100A may have substantially and/or completely planar surfaces as a result of respective portion(s) of the cover 112, alone or in combination with the respective protruding portion(s) 116A. More particularly, in some embodiments of the invention, the substantially continuous surface, e.g., two surfaces arranged close to and/or abutting each other, resulting from the abutting arrangement of the respective outer surface portion(s) of the cover 112 and the respective protruding portion(s) 116A may be substantially and/or completely planar. Embodiments of the invention, however, are not limited to such planar and/or completely planar surfaces for the wafer level package 100A and/or cover 112. That is, e.g., the protecting nature of the cover 112, may not depend on the respective surface(s) of the cover 112 being substantially and/or completely planar, i.e., may rather depend on a thickness of the cover 112. Thus, while a relatively precise tool or method may be employed to completely separate the semiconductor chip 104 from the wafer 102, the tool or method need not necessarily establish a smooth or planar surface.

More particularly, e.g., in some embodiments of the invention, the protruding portion 116A may correspond to a substantially rectangular shaped portion of the substrate of the semiconductor chip 104, and as shown in FIG. 1, other than the exposed surface(s) of the protruding portion 116A, which may be aligned with the respective outer surface portion(s) of the cover 112, the protruding portion(s) 116(A) may be completely surrounded by the cover 112.

As shown in FIG. 1, in some embodiments of the invention, except for the exposed connector(s) 110 and the protruding portion(s) 116A, the cover 112 may substantially completely and/or completely encapsulate the semiconductor chip 104.

Further, by providing portion(s) of the cover 112 even on the side(s), e.g., the top side, of the semiconductor chip 104 including the connector(s) 110, respective portions of the cover 112 may support and/or surround the connectors 110, and may improve joint reliability of the connector(s) 110. That is, e.g., lower portions of the connector(s) 110 may be surrounded respective portions of the cover 112. In some embodiments of the invention, the cover 112 may have a height H1 (see FIG. 13) of about 10% to about 80% of a height H2 (see FIG. 13) of the connector 110 relative to a respective surface, e.g., top surface, of the semiconductor chip 104. For example, in embodiments of the invention in which the connector(s) 110 are provided on the top side of the semiconductor chip 104 extending along a XY plane, the cover 112 may have a height H1 of about 10% to about 80% of the height H2 of the connector 110 along the Z direction. More particularly, if, e.g., the height H1 of the cover 112 is more than about 80% of the height H2 of the connector 110, electrical connectivity characteristics of the connector 110 may be threatened, and if, e.g., the height H1 of the cover 112 is less than about 10% of the height H2 of the connector 110, the cover 112 may not adequate serve to improve joint reliability of the connector 110 to the semiconductor chip 104.

A protruding height, i.e., thickness, of protruding portion(s) 116A relative to the respective side of the substrate may be no more than about 50% of a width Ws of scribe line 106 (see FIG. 7). As described in more detail below, the semiconductor chip 104 may be diced, i.e., separated from, the substrate, e.g., semiconductor wafer, by cutting within the scribe line(s) 106 surrounding the semiconductor chip 104. More particularly, e.g., if two semiconductor dies are formed adjacent to each on the substrate with a respective scribe line therebetween, the substrate may be diced such that about 50% of the scribe line remains on each of the resulting semiconductor chips 104. Further, in such embodiments, respective portion(s) of the cover 112 may have a thickness of less than about 50% of the width Ws of the corresponding scribe line 106.

Figure 2:
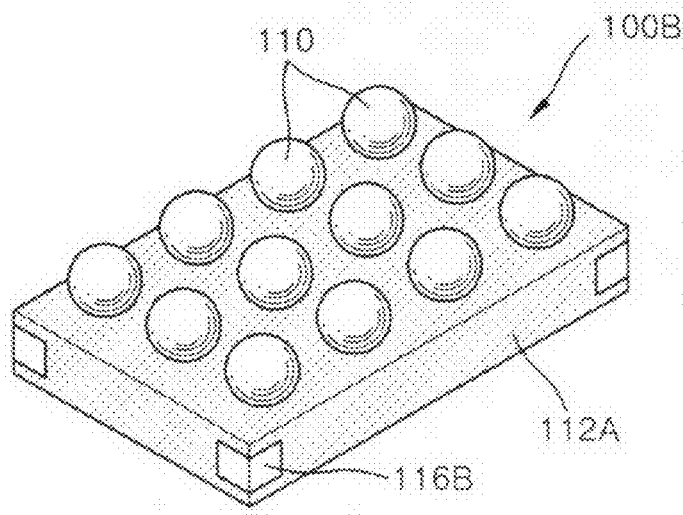
FIG. 2 illustrates a top-side view of a second exemplary embodiment of a wafer level package of a semiconductor chip.

FIG. 2 illustrates a second exemplary embodiment of a wafer level package 100B of a semiconductor chip 104A (see FIG. 8) including at least one protruding portion(s) 116B, arranged differently than protruding portion(s) 116A of the first exemplary embodiment illustrated in FIG. 1. In general, only differences between the first exemplary wafer level package 100A illustrated in FIG. 1 and the second exemplary embodiment of the wafer level package 100B will be described below.

Referring to FIG. 2, the wafer level package 100B may include a cover 112A, and the protruding portion(s) 116B of the semiconductor substrate may be arranged at edge, e.g., corner, portion(s) of the semiconductor chip 104A. Thus, according to this exemplary embodiment, at least one corner portion of the cover 112A may correspond to an exposed portion of the substrate of the semiconductor chip 104A. More particularly, in the exemplary embodiment illustrated in FIG. 2, each corner portion of the cover 112A may include an exposed portion of the substrate of the semiconductor chip 104A. Thus, in such an embodiment, assuming that the semiconductor chip 104A has a rectangular shape, each of the four lateral corners of the wafer-level package 100B may include a portion of the cover 112A and a respective exposed portion of the substrate of the semiconductor chip 104A.

Figure 3:
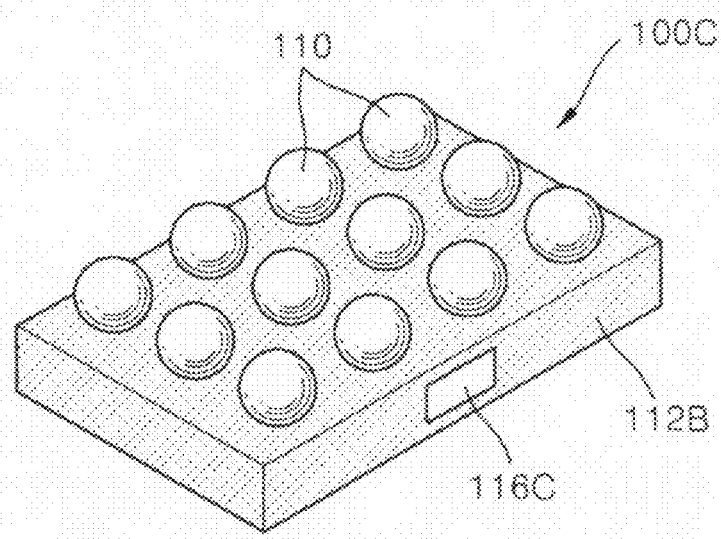
FIG. 3 illustrates a top-side view of a third exemplary embodiment of a wafer level package of a semiconductor chip.

FIG. 3 illustrates a third exemplary embodiment of a wafer level package 100C of a semiconductor chip 104B (see FIG. 9) including at least one protruding portion(s) 116C, arranged differently than protruding portion(s) 116A of the first exemplary embodiment illustrated in FIG. 1. In general, only differences between the first exemplary wafer level package 100A illustrated in FIG. 1 and the third exemplary embodiment of the wafer level package 100C will be described below.

Referring to FIG. 3, the wafer level package 100C may include a plurality of protruding portions 116C and a cover 112B. The protruding portions 116C may be arranged on opposing lateral sides of the cover 112B or opposing lateral sides of the semiconductor chip 104B. More particularly, e.g., the exemplary wafer level package 100C illustrated in FIG. 3 includes two protruding portions 116C arranged at substantially central portions of two opposing lateral sides of the cover 112B, i.e., corresponding to substantially central portions of two opposing lateral sides of the semiconductor chip 104B.

Figure 4:
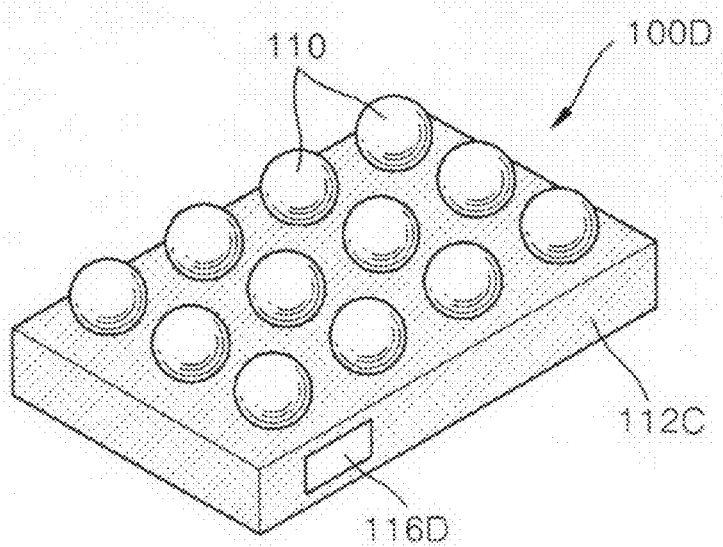
FIG. 4 illustrates a top-side view of fourth exemplary embodiment of a wafer level package of a semiconductor chip.

FIG. 4 illustrates a fourth exemplary embodiment of a wafer level package 100D of a semiconductor chip 104C (see FIG. 10) including at least one protruding portion(s) 116D, arranged differently than protruding portion(s) 116A of the first exemplary embodiment illustrated in FIG. 1. In general, only differences between the first exemplary wafer level package 100A illustrated in FIG. 1 and the fourth exemplary embodiment of the wafer level package 100D will be described below.

Referring to FIG. 4, the wafer level package 100D may include protruding portion(s) 116D and a cover 112C. The protruding portion(s) 116D may be arranged off-center from, e.g., substantially to a left or right side of a respective lateral side of the cover 112C or substantially to a left or right side of a respective lateral side of the semiconductor chip 104C. More particularly, e.g., the exemplary wafer level package 100D illustrated in FIG. 4 includes a single protruding portion 116D substantially to a left or right side of a lateral side of the cover 112C. Embodiments of the invention are not limited, however, to such an arrangement. For example, the single protruding portion 116D may be arranged at a substantially central portion or a corner portion of the cover 112C.

Further, in some embodiments of the invention, a combination of the exemplary configurations illustrated in, e.g., FIGS. 1 through 4 may be employed.

An exemplary method of fabricating a wafer level package according to one or more aspects of the invention will be described below with reference to FIGS. 5 through 14.

FIG. 5 illustrates a top view of a wafer 102 including a plurality of semiconductor chips 104. As illustrated in FIG. 5, the plurality of semiconductor chips 104, i.e., semiconductor dies corresponding to respective semiconductor chips 104, may be formed on a wafer 102, e.g., a semiconductor wafer. The semiconductor chips 104 may be diced, i.e., separated, from a remaining portion of the wafer 102 by, e.g., cutting or breaking within the scribe line 106 (see FIG. 7) surrounding each semiconductor chip 104. After being diced from the wafer 102, the respective semiconductor chips 104 may each include a portion of the wafer 102 as the substrate of the semiconductor chip 104. The wafer 102 may be, e.g., a semiconductor wafer such as a silicon wafer.

Figure 6:
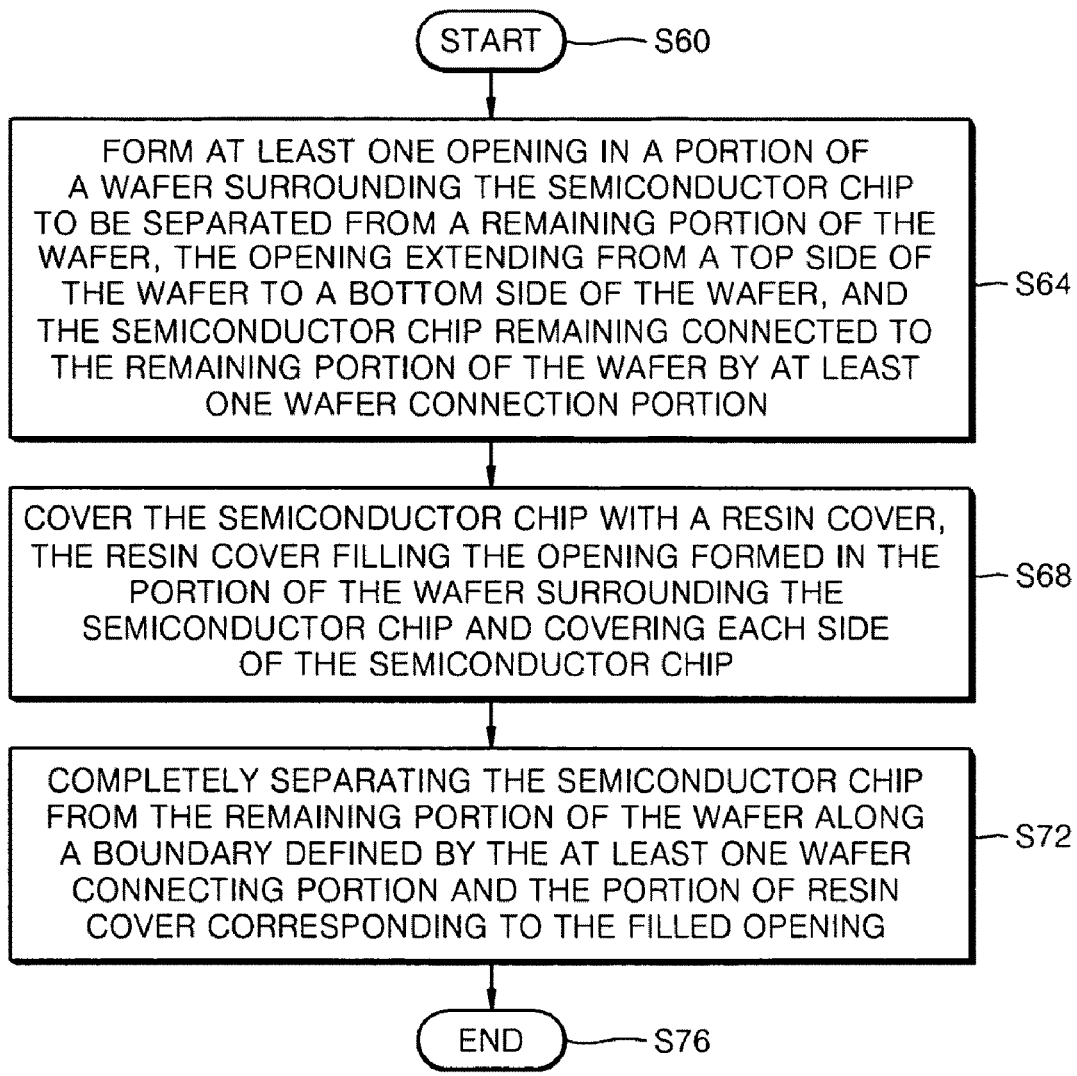
FIG. 6 illustrates a flow-chart of an exemplary method for fabricating a wafer level package according to one or more aspects of the invention.
Figure 8:
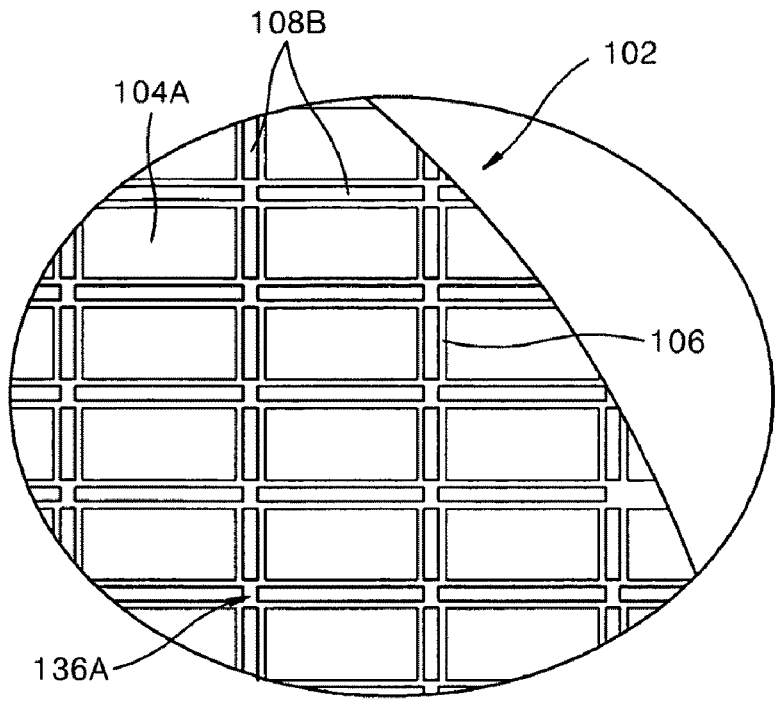
FIG. 8 illustrates a top view of a stage in an exemplary method for fabricating the wafer level package of FIG. 2.
Figure 9:
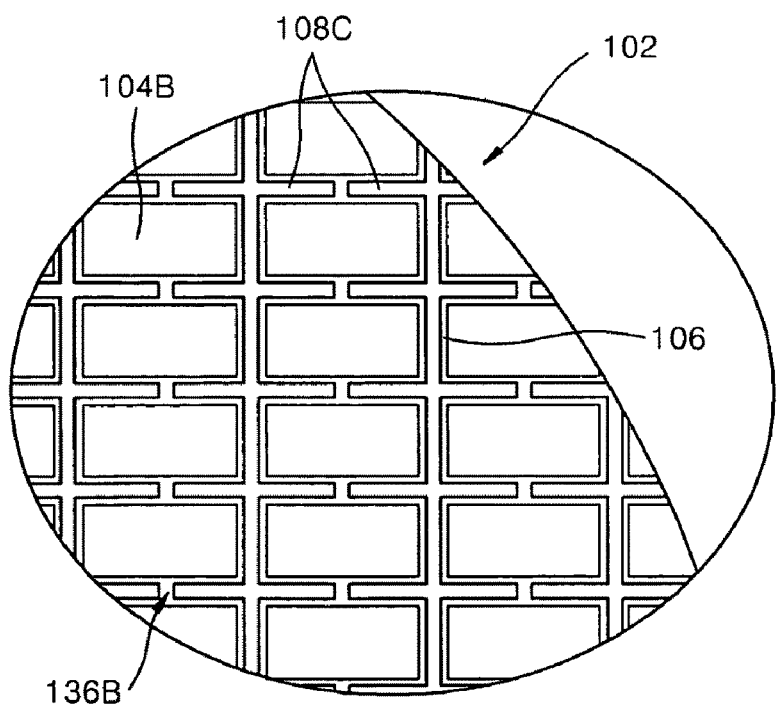
FIG. 9 illustrates a top view of a stage in an exemplary method for fabricating the wafer level package of FIG. 3.
Figure 10:
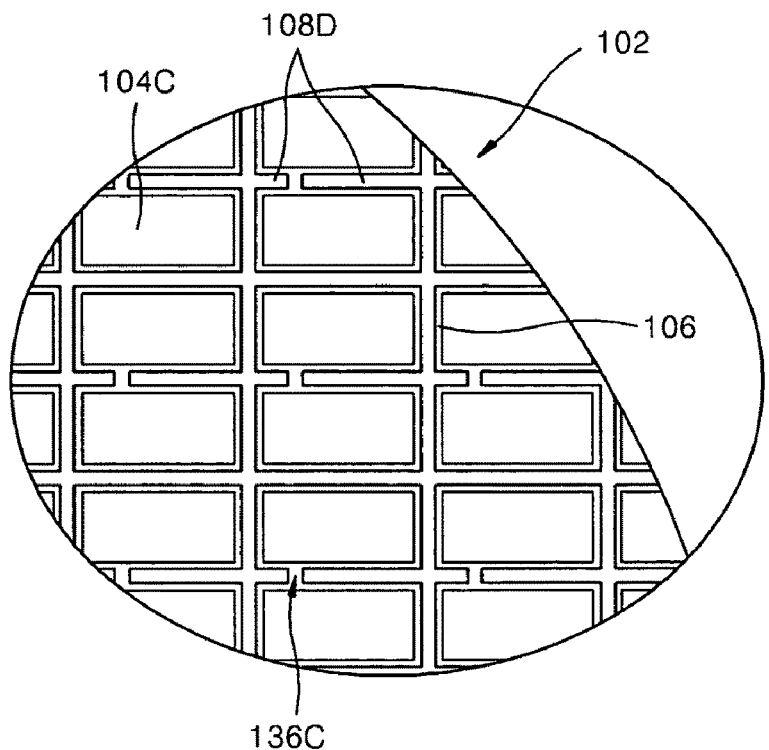
FIG. 10 illustrates a top view of a stage in an exemplary method for fabricating the wafer level package of FIG. 4.

FIG. 6 illustrates a flow-chart of an exemplary method for fabricating a wafer level package according to one or more aspects of the invention; FIG. 7 illustrates a top view of a stage in an exemplary method for fabricating the wafer level package of FIG. 1; FIG. 8 illustrates a top view of a stage in an exemplary method for fabricating the wafer level package of FIG. 2; FIG. 9 illustrates a top view of a stage in an exemplary method for fabricating the wafer level package of FIG. 3; FIG. 10 illustrates a top view of a stage in an exemplary method for fabricating the wafer level package of FIG. 4; and FIGS. 11, 12, 13 and 14 illustrate additional stages in the exemplary method for fabricating the wafer level packages of FIGS. 1 through 4 according to one or more aspects of the invention.

Referring to FIGS. 1, 6 and 7, fabricating the wafer level package 100A according to one or more aspects of the invention may begin at step S60 during which a wafer 102 including at least one semiconductor chip 104 formed thereon may be provided.

Still referring to FIGS. 6 and 7, the exemplary method may then proceed to step S64 during which at least one opening 108A may be formed in a portion of the wafer 102 surrounding the semiconductor chip 104 to partially separate the semiconductor wafer 104 from a remaining portion of the wafer 102. The opening(s) 108A may completely extend through a thickness of the wafer 102, e.g., completely from the top side of the wafer 102 to the bottom side of the wafer 102 along the Z direction (e.g., a peek-hole like opening through the wafer 102 enabling one to see something arranged below the wafer 102 from a point above the wafer 102). In embodiments of the invention, while the opening(s) 108A may extend completely through a thickness of the wafer 102, the opening(s) 108A define at least one connecting portion 136 for keeping the semiconductor chip 104 partially connected to the remaining portion of the wafer 102 at this stage in exemplary the wafer level package fabricating method. At least some of the connecting portion 136 may be shared between two or more adjacent ones of the semiconductor chips 104 on the wafer 102.

Referring to FIG. 7, the opening(s) 108A may be formed within the scribe lines 106 surrounding the respective semiconductor chip 104. The opening(s) 108A may be formed by, e.g., sawing corresponding portion(s) of the wafer 102 using, e.g., a laser, a diamond blade, or other known cutting/sawing materials and/or methods. A width of the opening(s) 108A may be substantially the same as or less than the width Ws of the scribe line 106, e.g., a first cutting width of a first laser cutting step may be substantially the same as or less than the width Ws of the scribe line 106. The openings 108A may correspond to one or more of the semiconductor chips 104. For example, in some embodiments, the openings 108A may extend from one lateral side of the wafer 102 to an opposing lateral side of the wafer 102 and may be associated with a plurality of semiconductor chips 104 arranged in, e.g., a row or column, while in some other embodiments, the openings 108A may be associated with, e.g., one, two or four semiconductor chips 104.

The opening(s) 108A may have various shapes depending on an arrangement of the at least one protruding portion 116A to be provided. More particularly, e.g., the openings 108A may be provided to form the wafer level package 100A of FIG. 1. The openings 108A may form the connecting portion 136 on each lateral side of the semiconductor chip 104. In this exemplary embodiment, a total of four connecting portions 136 may be provided as a result of, e.g., respective portions of, e.g., four openings 108A partially surrounding the semiconductor chip 104. More particularly, in this exemplary embodiment, the connecting portions 136 may be provided at a substantially central portion of each lateral side of the semiconductor chip 104. Embodiments of the invention are not, however, limited to such an arrangement and/or number of openings 108A and/or connecting portions 136.

For example, referring to FIG. 8, openings 108B may be provided to form the wafer level package 100B of FIG. 2. In general, only differences between the openings 108B illustrated in FIG. 8 and the openings 108A illustrated in FIG. 7 will be described below. Thus, e.g., the openings 108B may also extend completely through a thickness of the wafer 102. In this exemplary embodiment, the openings 108B may form, e.g., a connecting portion 136A at each corner of the semiconductor wafer 104A. More particularly, in this exemplary embodiment, four connecting portions 136A may be at least partially defined as a result of, e.g., respective portions of, e.g., four openings 108B partially surrounding the semiconductor chip 104A. The connecting portions 136A may be provided at, e.g., each lateral corner portion of the semiconductor chip 104A.

In another exemplary embodiment, referring to FIG. 9, openings 108C may be provided to form the wafer level package 100C of FIG. 3. In general, only differences between the openings 108C illustrated in FIG. 9 and the openings 108A illustrated in FIG. 7 will be described below. Thus, e.g., the openings 108C may also extend completely through a thickness of the wafer 102. In this exemplary embodiment, the openings 108C may form, e.g., a connecting portion 136B at opposing lateral sides of the semiconductor wafer 104B. More particularly, in this exemplary embodiment, two connecting portions 136B may be defined as a result of, e.g., respective portions of, e.g., two openings 108C partially surrounding the semiconductor chip 104B. The connecting portions 136B may be provided at, e.g., central portions of the respective lateral opposing sides of the semiconductor chip 104A.

In another exemplary embodiment, referring to FIG. 10, openings 108D may be provided to form the wafer level package 100D of FIG. 4. In general, only differences between the openings 108D illustrated in FIG. 10 and the openings 108A illustrated in FIG. 7 will be described below. Thus, e.g., the openings 108D may also extend completely through a thickness of the wafer 102. In this exemplary embodiment, the openings 108D may form, e.g., a connecting portion 136C at one lateral side of the semiconductor wafer 104C. More particularly, in this exemplary embodiment, a single connecting portion 136C may be defined as a result of a single opening 108D partially surrounding the semiconductor chip 104C. The connecting portion 136C may be provided at, e.g., a central portion or a left or right side portion of the lateral side of the semiconductor chip 104C. That is, in some embodiments of the invention, e.g., a single opening, such as opening 108D, may be formed to define a single connecting portion 136C for each of the semiconductor chips 104C on the wafer 102.

Referring back to FIG. 6, after forming the openings, e.g., 108A, 108B, 108C, 108D during step S64, the exemplary method may then proceed to step S68. During step S68, the semiconductor chip, e.g., 104, 104A, 104B, 104C, may be covered with, e.g., a resin.

More particularly, each side of the semiconductor chip, e.g. 104, 104A, 104B, 104C may be covered with resin and the respective opening(s), e.g., 108A, 108B, 108C, 108D, may be filled. In some embodiments, a thickness of the resin on respective sides of the semiconductor chip, e.g., 104, 104A, 104B, 104C, may be substantially uniform, while in some other embodiments, a thickness of the resin may vary on some or all sides of the semiconductor chip, e.g., 104, 104A, 104B, 104C. While each side of the semiconductor chip, e.g., 104, 104A, 104B, 104C may be completely covered with the resin, as shown in FIGS. 1 through 4, upper portions of the respective connectors 110 remain exposed. For simplicity, the remaining steps of the exemplary method will be described with reference to the exemplary wafer level package 100A illustrated in FIG. 1. However, the method described may be used to form any of the described exemplary wafer level packages 100A, 100B, 100C, 100D and other embodiments of the invention.

Figure 11:
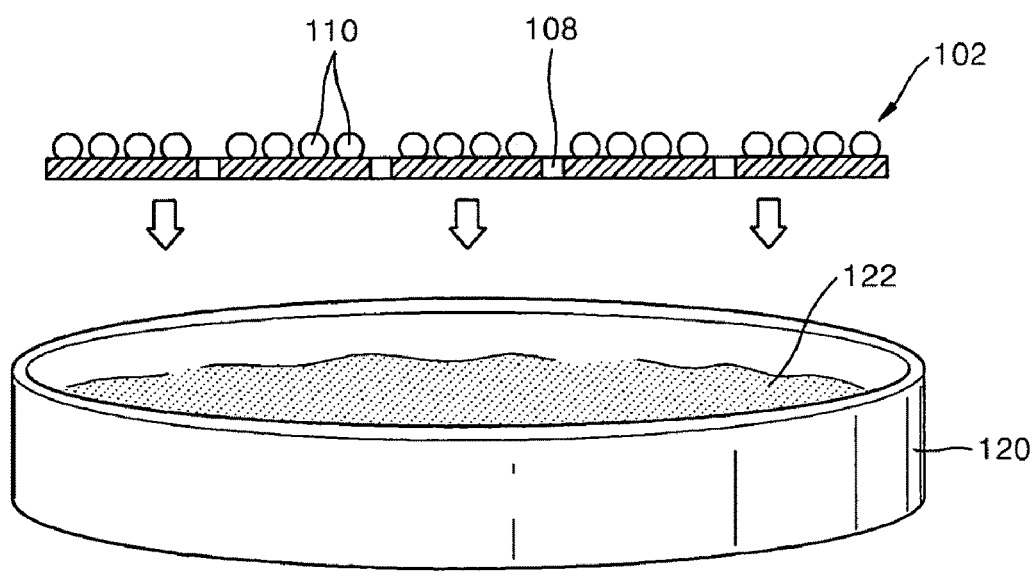
FIGS. 11, 12, 13 and 14 illustrate additional stages in the exemplary method for fabricating the wafer level packages of FIGS. 1 through 4 according to one or more aspects of the invention.

FIG. 11 illustrates an exemplary method of covering the semiconductor chip 104 with resin by dipping the wafer 102 including semiconductor chips 104, including opening(s) 108 in a bath 120 containing, e.g., epoxy resin 122, i.e., a thermosetting polymer. The epoxy resin 122 may include, e.g., a catalyzing agent, i.e., hardener, such that the cover 112 may be formed when the wafer 102 is covered by the epoxy resin 122. More particularly, the wafer 102 may be partially dipped in the epoxy resin 122 such that upper portion(s) of the connector(s) 110 may remain resin-free, i.e., exposed. That is, by dipping the wafer 102 in the epoxy resin, all sides of the semiconductor chip(s) 104 and/or the respective opening(s) 108 may be simultaneously and/or substantially simultaneously covered with, e.g., epoxy resin 122 in a single processing step. Thus, embodiments of the invention may provide a simplified method of substantially completely encapsulating the semiconductor chip(s) 104, e.g., completely encapsulating the semiconductor chip(s) 104 except for the connector(s) 110 and the at least one connecting portion 136, in a single covering step.

More particularly, the bath 120 may be vibrated while the wafer 102 is dipped therein to help ensure that the epoxy resin 122 covers all sides of the semiconductor chip(s) 104 and fills, e.g., completely fills, the opening(s) 108A surrounding the semiconductor chip(s) 104. Although a dipping method is illustrated in FIG. 11 for covering the semiconductor chip 104 with, e.g., the resin, other methods of covering the semiconductor chip 104 may be employed. More particularly, e.g., other known methods for simultaneously covering all sides of the semiconductor chip 104 in a single covering step may be employed.

Figure 12:
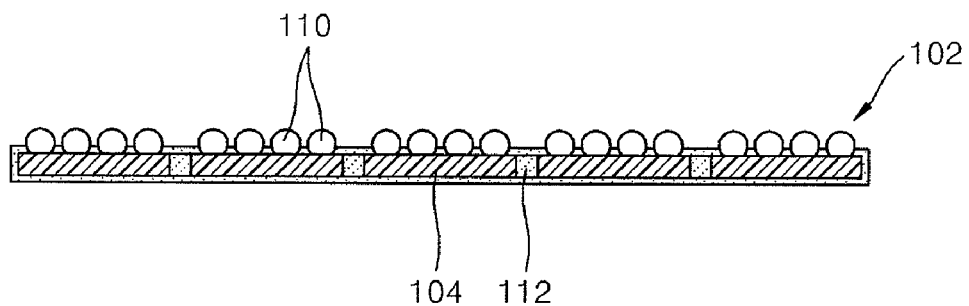
Figure 13:
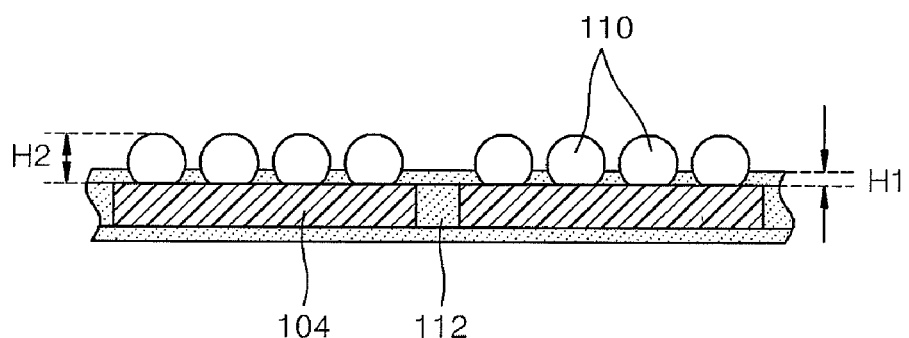

FIG. 12 illustrates a cross-sectional view of the wafer 102 after covering all the sides of the semiconductor chip(s) 104, i.e., after the covering step S68, and FIG. 13 illustrates a more detailed cross-sectional view of a portion of the wafer 102 after the covering step S68. As shown in FIG. 12, after the covering step S68, the cover 112 may substantially completely encapsulate the semiconductor chip(s) 104, except for the connector(s) 110 and the at least one connecting portion 136.

Referring to FIG. 13, in some embodiments of the invention, the height H1 of the cover may be about 10% to about 80% of the height H2 of the connector 110.

Referring again to FIG. 6, after covering all the sides of the semiconductor chip(s) 104 on the wafer 102, i.e., step S68, the method may proceed to step S72. During step S72, the semiconductor chip(s) 104 may be completely separated from the wafer 102.

Figure 14:
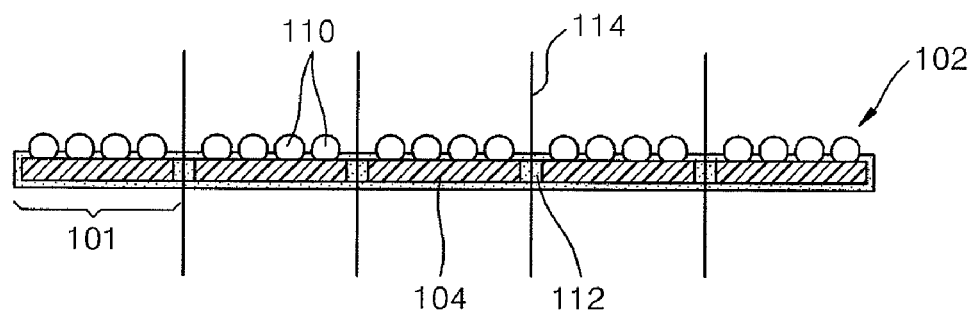

FIG. 14 illustrates a cross-sectional view of the wafer 102 after covering all the sides of the semiconductor chip(s) 104, i.e., after the covering step S68, including second cutting boundary 114. Another cutting step employing, e.g., a laser or diamond blade, may be performed to completely separate the semiconductor chip(s) 104 by cutting along the respective cutting boundary 114. The cutting boundary 114 may correspond to an imaginary predetermined line, lane or region between, e.g., the respective semiconductor chip(s) 104. Further, after the completely separating step S72, portions of the respective connecting portion(s) 136 may correspond to the protruding portion(s) 116A.

As discussed above, during the first cutting step for forming the opening(s) 108, the width Ws of the scribe line 106, corresponding to the first cutting width, i.e., step S64, may be substantially the same as or less than the width Ws of the scribe line 106. In some embodiments of the invention, during the second cutting step for completely separating the semiconductor chip(s) 104 from the wafer 102, i.e., step S72, a second cutting width may be less than the first cutting width. That is, in embodiments of the invention, step S72 may be carried out so as to provide the resulting portion of the cover 112, corresponding to where the resin 122 filled the opening(s) 108, with a sufficient width to protect the semiconductor chip 104a from damage, e.g., external impact. That is, a relationship between the first cutting width and the second cutting width may determine a distance that the resulting protruding portion(s) 116A may protrude from the respective side(s) of the semiconductor chip 104, and thus, may determine an efficacy of the protruding portion 116A as a protection member. More particularly, e.g., if the first cutting width was about 80 µm and the second cutting width is about 20 µm, a width of the resulting protruding portion 116A of the cover 112 after step S72, may be about 30 µm. Referring to FIG. 6, the exemplary method may then be complete, i.e., step S76.

FIGS. 15, 16, 17 and 18 illustrate stages in a second exemplary method for fabricating a wafer level package according to one or more aspects of the invention. In general, only differences between the exemplary embodiment illustrated in FIGS. 15-18 and the exemplary embodiment described above will be described below.

Figure 15:
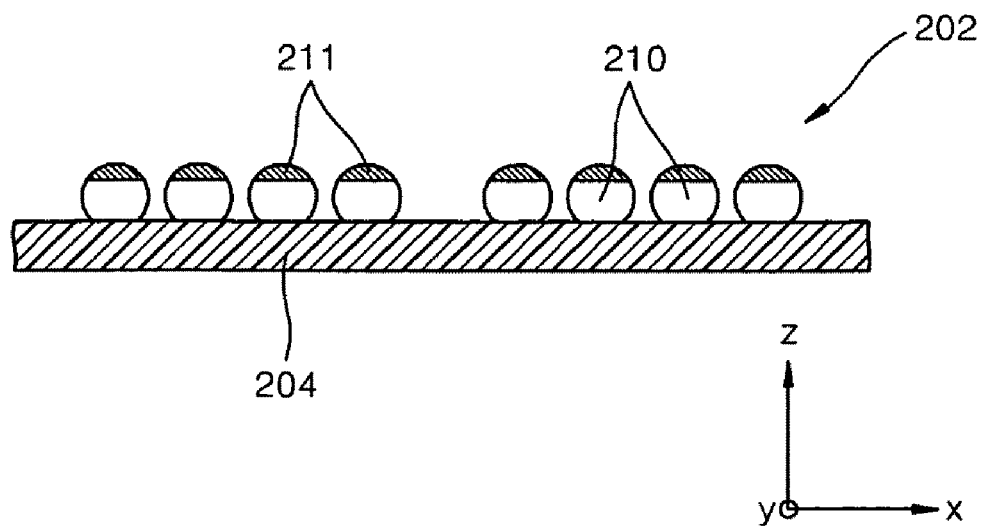
FIGS. 15, 16, 17 and 18 illustrate stages in a second exemplary method for fabricating a wafer level package according to one or more aspects of the invention.

Referring to FIG. 15, according to the second exemplary embodiment, the resin coating process includes a spin coating method instead of the dipping method. According to the second exemplary method, the process may begin by forming a coating repellent 211 on upper portions of each connector 210 provided on semiconductor chip 204 formed on a wafer 202. In some embodiments of the invention, a thickness of the coating repellent 211 on the upper portion of each connector 210 may not exceed about 50% of a height of the connector 210, e.g., a distance that the connector 210 projects above a top surface of the wafer 202.

Figure 16:
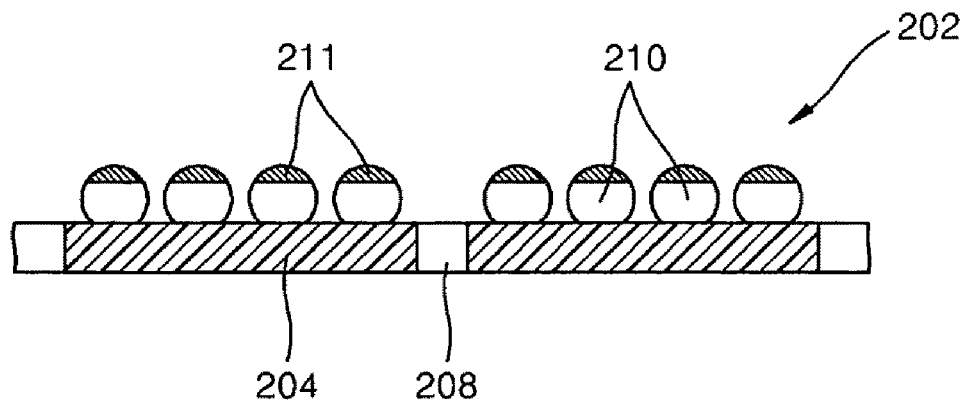

Next, referring to FIG. 16, at least one opening 208 may be formed in the wafer 202 around the respective semiconductor chip 204. The opening 208 may correspond, e.g., to any of the exemplary openings 108A, 108B, 108C, 108D described above.

Figure 17:
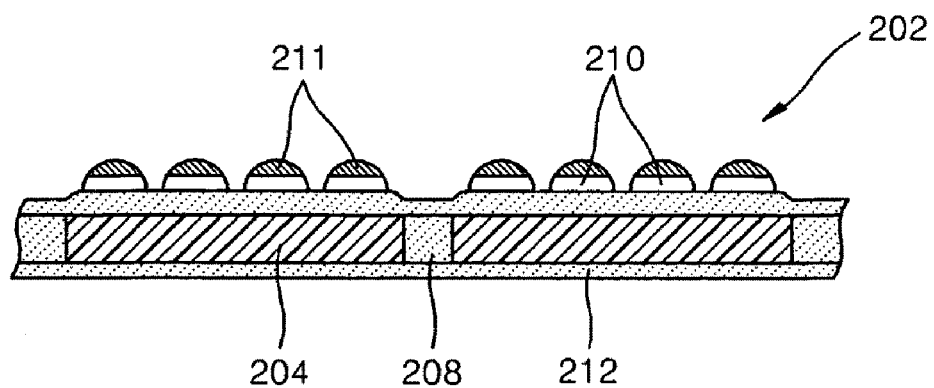

Next, referring to FIG. 17, a spin coating process may be performed to coat all sides of the semiconductor chip 204 during a single coating step. In this exemplary embodiment, the wafer 202 may be arranged on a chuck (not shown) and may be spun while resin is deposited thereon. While the wafer 202 is being spun by the chuck, the wafer may be slightly elevated above a surface of the chuck such that the resin may coat a bottom surface of the wafer 202 while coating a top surface thereof and filling, e.g., completely filling, the opening(s) 208 to form a cover 212. The cover 212 may substantially completely encapsulate the semiconductor chip 204, except for the connector(s) 210 and at least one protruding portion (not shown) thereof.

Figure 18:
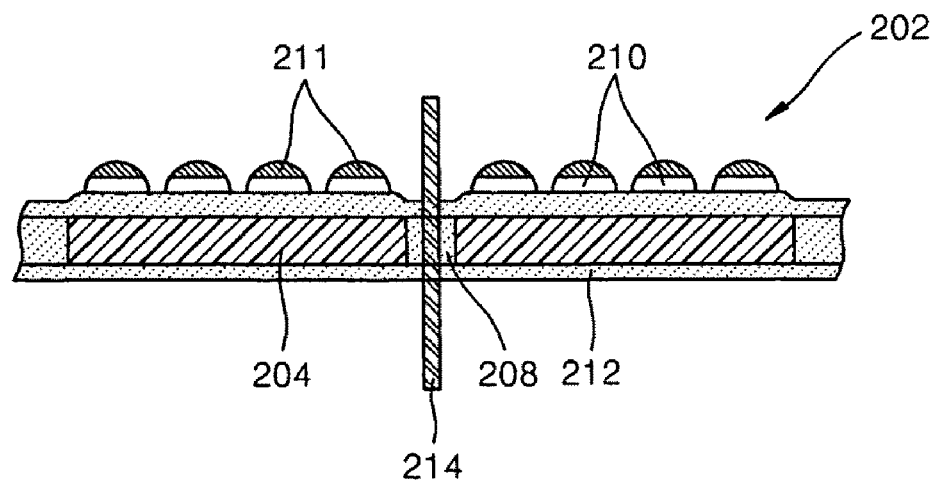

Next, referring to FIG. 18, similar to the process described above with regard to FIG. 14, the semiconductor chip(s) 204 may be completely separated from the wafer 202 by a second cutting step along a cutting boundary 214 using, e.g., a laser or a diamond blade having a width that less than a width of a laser or diamond blade used to form the opening(s) 208. By using, e.g., a laser or diamond blade during the second cutting step, i.e., the completely separating step S72, that has a smaller width than a width of the laser or diamond blade used during the first cutting step, i.e., the partially separating step, a distance that resulting protruding portions protrude from a respective side of the semiconductor wafer 204 may be controlled to ensure that that cover 212 may serve to protect the semiconductor wafer 204 therein.

Multi-chip packages (MCPs) enable discrete components, which may be implemented in a same or different technology, to be integrated into a single IC package. MCPs are increasing in popularity for a wide range of applications, e.g., MCPs for mobile phone applications, MCP memories that integrate, e.g., flash memory and a controller. Aspects of packaging embodiments discussed above may be employed, e.g., to implement such MCPs. For example, when fabricating MCPs, the covering step S68 and/or the completely separating step S72 may be executed after vertically stacking wafers including discrete components of the MCP to be integrated.

Figure 19:
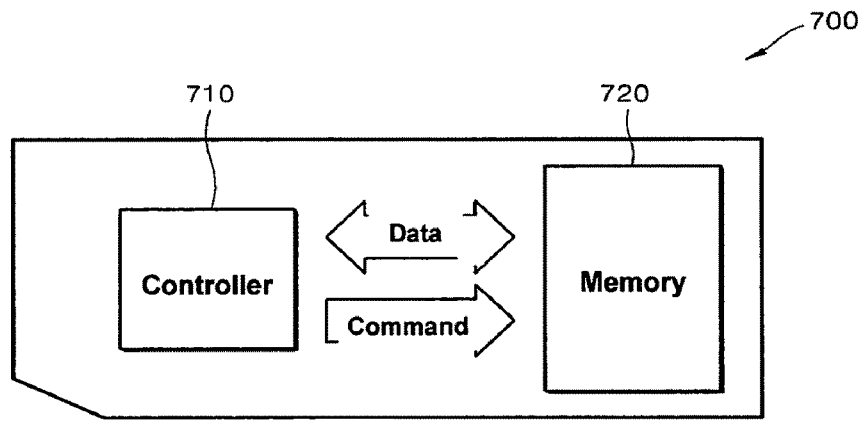
FIG. 19 illustrates an exemplary memory card that may be implemented according to one or more aspects of the invention.

FIG. 19 illustrates an exemplary card system 700, e.g., a multi-media card or a secure digital card, which may be implemented according one or more aspects of the invention. Referring to FIG. 19, the card 700 may include a controller 710 and a memory 720. The memory 720 may be, e.g., a flash memory, a PRAM, a DRAM, etc. For example, the memory 720, the controller 710 and an interface therebetween for exchanging, e.g., data and/or commands, may be packaged together as an MCP using one or more aspects of the invention.

Figure 20:
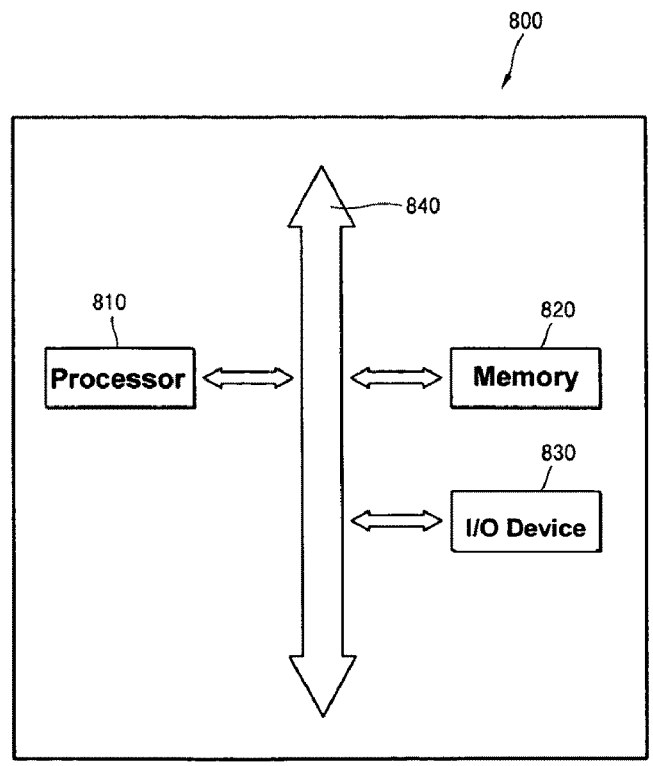
FIG. 20 illustrates an exemplary electronic system that may be implemented according to one or more aspects of the invention.

FIG. 20 illustrates an exemplary electronic system 800, which may be implemented according to one or more aspects of the invention. Referring to FIG. 20, the system 800 may include a processor 810, a memory 820, an I/O (input/output) device 830 and a bus 840. The system 800 may be, e.g., a mobile phone, an MP3 device, a navigation system, a solid state disk (SSD), a household appliance, etc. For example, the memory 820, the processor 810, the I/O device 830 and the bus 840 may be packaged together as an MCP using one or more aspects of the invention. More particularly, e.g., in some cases, one, some or all of the memory 820, the processor 810 and the I/O device 840 may be vertically stacked on each other before being packaged as an MCP according to one or more aspects of the packaging embodiments described above.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A packaged semiconductor device, comprising:
a substrate including at least one semiconductor chip layer and at least one connector arranged on the semiconductor chip layer, the substrate including a plurality of sides; and
a resin cover covering each side of the substrate, the resin cover on at least one side of the substrate including an opening exposing the connector and the resin cover on at least one other side of the substrate exposing a portion of the substrate,
wherein a portion of the resin cover on the side of the substrate including the at least one connector surrounds a lower portion of the connector and has a height of 10% to 80% of a height of the at least one connector, the heights being measured along a direction substantially perpendicular to a plane along which a surface of the substrate on which the connector is arranged extends.

2. The packaged semiconductor as claimed in claim 1, wherein the resin cover is an outermost layer on each of the sides of the substrate.

3. The packaged semiconductor as claimed in claim 1, wherein each outer surface of the resin cover is substantially or completely planar.

4. The packaged semiconductor as claimed in claim 1, wherein a portion of the resin cover exposing the portion of the substrate abuts a sidewall of the exposed portion of the substrate, and an outer surface of the abutting portion of the resin cover extends along a same plane as a plane along which a surface of the exposed portion of the substrate extends.

5. The packaged semiconductor as claimed in claim 1, wherein:
the plurality of sides of the substrate includes a top side, a bottom side, and a plurality of lateral sides, and the top side includes a plurality of the connectors arranged thereon,
the resin cover on the top side includes a plurality of openings respectively exposing the connectors, and
the resin cover on the at least other side of the substrate is on at least one of the lateral sides, and exposes a portion of at least one of the lateral sides of the substrate.

6. The packaged semiconductor as claimed in claim 5, wherein the resin cover exposes a portion of each of the lateral sides of the substrate.

7. The packaged semiconductor as claimed in claim 5, wherein the resin cover exposes a portion of only two of the lateral sides of the substrate, the two lateral sides being opposite each other.

8. The packaged semiconductor as claimed in claim 5, wherein the resin cover exposes a portion of only one of the lateral sides of the substrate.

9. The packaged semiconductor as claimed in claim 1, wherein other than the exposed at least one connector and the exposed portion of the at least one other side, the resin cover completely encapsulates the substrate.

10. The packaged semiconductor as claimed in claim 9, wherein the resin cover is a single continuous layer.

11. The packaged semiconductor as claimed in claim 1, wherein the exposed portion of the substrate corresponds to a lateral corner portion of the substrate.

12. A packaged semiconductor device, comprising:
a substrate including at least one semiconductor chip layer and at least one connector arranged on the semiconductor chip layer, the substrate including a plurality of sides, and the substrate having been cut from a wafer along a scribe line of the wafer, the scribe line having had a width; and
a resin cover covering each side of the substrate, the resin cover on at least one side of the substrate including an opening exposing the connector and the resin cover on at least one other side of the substrate exposing a portion of the substrate, wherein:

the substrate is a portion of the semiconductor wafer, and a thickness, relative to the at least one other side of the substrate, of at least a portion of the resin cover abutting the at least one exposed portion of the substrate is equal to or less than 50% of the width of the scribe line.

13. The packaged semiconductor as claimed in claim 1, wherein the packaged semiconductor is an MCP.

14. A method of manufacturing a wafer level package, comprising:
   forming at least one opening in a portion of a wafer surrounding a predetermined sub-portion of the wafer corresponding to a device to be separated from a remaining portion of the wafer by removing a portion of the wafer in a scribe line of the wafer, the opening completely extending from a top side of the wafer to a bottom side of the wafer, and the wafer sub-portion remaining connected to the remaining portion of the wafer by at least one wafer connecting portion;
   covering the wafer sub-portion with a resin cover, the resin cover filling the opening formed in the portion of the wafer surrounding the wafer sub-portion and covering each side of the wafer sub-portion; and
   completely separating the wafer sub-portion from the remaining portion of the wafer along a boundary defined by the at least one wafer connecting portion and the portion of resin cover corresponding to the filled opening, wherein:
   at least one side of the wafer sub-portion includes at least one connector arranged thereon,
   covering the wafer sub-portion includes covering the wafer sub-portion, other than the at least one connector of the device and a separated side of the wafer connecting portion, the separated side corresponding to the side of the wafer connected portion exposed when separating the wafer sub-portion from the remaining portion of the wafer, and
   a thickness of a remaining portion of the resin cover relative to the respective side of the wafer-sub portion is equal to or less than about 50% of a width of the scribe line of the wafer.

15. The method as claimed in claim 14, wherein covering the wafer sub-portion comprises completely covering the side of the wafer sub-portion having the at least one connector arranged thereon, except for the at least one connector arranged thereon.

16. The method as claimed in claim 15, wherein covering the wafer sub-portion comprises completely encapsulating the wafer sub-portion, other than the at least one connector of the device and the separated side of the wafer connecting portion.

17. The method as claimed in claim 15, wherein covering the wafer sub-portion with the resin cover comprises one of dipping the wafer in a thermosetting epoxy resin solution, and applying an epoxy layer using a spin coating process.

18. The method as claimed in claim 17, wherein applying the epoxy layer using a spin coating process comprises:
   coating at least a top portion of the at least one connector with a coating repellent before covering the wafer sub-portion with the resin cover.

19. The method as claimed in claim 17, wherein applying the epoxy layer using a spin coating process comprises:
   during the spin coating process using a spin chuck, temporarily elevating the wafer sub-portion away from an upper surface of the spin chuck to cover the bottom side of the wafer while simultaneously filling the opening and covering each of the other sides of the wafer sub-portion.

20. The method as claimed in claim 17, wherein dipping the wafer in a thermosetting epoxy resin solution comprises partially dipping the wafer in the epoxy resin solution such that, other than an upper portion of the at least one connector, a remainder of the wafer is dipped into the epoxy resin solution.

21. The method as claimed in claim 14, wherein forming the at least one opening comprises using at least one of a diamond blade and a laser having a first width, and completely separating the wafer sub-portion comprises using at least one of a diamond blade and a laser having a second width, wherein the first width is greater than the second width.

22. The method as claimed in claim 14, wherein covering the wafer sub-portion with the resin cover is performed in a single covering process such that the opening formed in the portion of the wafer surrounding the wafer sub-portion and each side of the wafer sub-portion are simultaneously or substantially simultaneously filled and covered, respectively.

23. The method as claimed in claim 14, further comprising, before covering or before completely separating, stacking at least another wafer on the wafer, the at least another wafer including another device to be integrated with the device on the wafer.

* * * * *